US008674237B1

United States Patent
Gilliland et al.

(10) Patent No.: US 8,674,237 B1
(45) Date of Patent: Mar. 18, 2014

(54) IMPLEMENTING PRESS-LOCK EMC GASKET WITH ABSORBER

(75) Inventors: Don A. Gilliland, Rochester, MN (US); Rebeccah J. Vossberg, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 13/593,198

(22) Filed: Aug. 23, 2012

(51) Int. Cl.
*H05K 9/00* (2006.01)
(52) U.S. Cl.
USPC .............................. 174/354; 174/356; 277/920
(58) Field of Classification Search
USPC ............................ 174/354, 355, 356; 277/920
See application file for complete search history.

(56) References Cited

U.S. PATENT DOCUMENTS

| | | | | |
|---|---|---|---|---|
| 4,623,752 A * | 11/1986 | Steen et al. | ................... | 277/637 |
| 5,001,297 A * | 3/1991 | Peregrim et al. | .............. | 174/354 |
| 5,045,635 A * | 9/1991 | Kaplo et al. | ................... | 174/354 |
| 5,194,691 A * | 3/1993 | McIlwraith | .................... | 174/354 |
| 5,250,751 A * | 10/1993 | Yamaguchi | .................... | 174/354 |
| 6,163,454 A | 12/2000 | Strickler | | |
| 6,201,182 B1 * | 3/2001 | Sosnowski | .................... | 174/369 |
| 6,225,555 B1 * | 5/2001 | Sosnowski | .................... | 174/355 |
| 6,355,878 B1 * | 3/2002 | Kim | .............................. | 174/355 |
| 6,744,641 B2 * | 6/2004 | Schnabel | ...................... | 361/818 |
| 7,170,013 B2 * | 1/2007 | Lewis | ........................... | 174/354 |
| 7,199,310 B2 | 4/2007 | Cochrane | | |
| 7,371,977 B1 | 5/2008 | Preonas | | |
| 7,442,880 B2 * | 10/2008 | Nasstrom et al. | ............. | 174/354 |
| 7,451,536 B2 * | 11/2008 | Sosnowski | ...................... | 29/446 |
| 7,532,473 B2 | 5/2009 | Kuo | | |
| 7,619,169 B1 * | 11/2009 | Ho et al. | ....................... | 174/354 |

\* cited by examiner

*Primary Examiner* — Hung Ngo
(74) *Attorney, Agent, or Firm* — Joan Pennington

(57) ABSTRACT

A method and structures are provided for implementing press-lock electromagnetic compatibility (EMC) gaskets. A gasket includes a plurality of fasteners received through a plurality of corresponding mounting apertures in a perforated support surface for precise placement, and retention without adhesives. The corresponding mounting apertures have a diameter smaller than ½0th of a wavelength of the highest frequency to be suppressed to remain independent of the shielding required. The gasket defines a cavity receiving compliant foam, and includes an absorber.

20 Claims, 6 Drawing Sheets

US 8,674,237 B1

IMPLEMENTING PRESS-LOCK EMC GASKET WITH ABSORBER

FIELD OF THE INVENTION

The present invention relates generally to the field of electromagnetic compatibility (EMC) shielding, and more particularly, to a method, and structures for implementing press-lock electromagnetic compatibility (EMC) gaskets with an absorber.

DESCRIPTION OF THE RELATED ART

As silicon technologies move toward smaller transistor sizes with smaller feature sizes, packaging densities increase, and operating frequencies increase, the need to contain or minimize electromagnetic interference (EMI) increases.

Electromagnetic compatibility (EMC) requires shielding to contain or minimize electromagnetic interference emissions from an electronic circuit packaging design. Gaskets often are used to fill and electronically bond and seal leaky apertures, for example, in chassis or panel members in order to maintain a minimum shielding effectiveness over a defined frequency spectrum.

In critical applications where varying temperature or normal or shear forces prevent the use of adhesive, a mechanical method of attaching a gasket is needed. Adhesives are sensitive to storage conditions, shelf life, and application temperature, and the like, controlling the variables and specifically storage conditions, globally are difficult.

A need exists for effective structures for implementing press-lock EMC gaskets with an absorber. It is desirable to provide such structures for implementing press-lock EMC gaskets with an absorber that have a generally simple configuration and are generally easy to assemble and that are inexpensive to produce.

The term electromagnetic compatibility (EMC) should be understood to include, and to be used interchangeably with, electromagnetic interference (EMI), electrical conduction and/or grounding, corona shielding, radio frequency interference (RFI), and electro-static discharge (ESD) protection.

SUMMARY OF THE INVENTION

Principal aspects of the present invention are to provide a method, and structures for implementing press-lock electromagnetic compatibility (EMC) gaskets with an absorber. Other important aspects of the present invention are to provide such method and structures substantially without negative effects and to overcome many of the disadvantages of prior art arrangements.

In brief, a method, and structures are provided for implementing press-lock electromagnetic compatibility (EMC) gaskets. A gasket includes a plurality of fasteners received through a plurality of corresponding mounting apertures in a perforated surface for precise placement, and retention without adhesives. The corresponding mounting apertures have a diameter smaller than ½0th of a wavelength of the highest frequency to be suppressed to remain independent of the shielding required. The gasket defines a cavity receiving compliant foam, and includes an absorber.

In accordance with features of the invention, the fasteners include a shaft and an enlarged resilient head received through the corresponding aperture for retaining the gasket with the perforated surface. The enlarged resilient head optionally has a profile for preventing easy removal. The fasteners optionally include a fabric wrapping.

In accordance with features of the invention, the fasteners are formed of either an electrically nonconductive or electrically conductive material, for example, a plastic material or a metal material. An electrically conductive shank of the fasteners optionally includes a diameter filling the corresponding mounting apertures for providing lower impedance.

In accordance with features of the invention, the gasket includes an absorber base disposed above the cavity receiving compliant foam carrying a second absorber positioned above the absorber base. The absorber base optionally is formed of an RF absorber material, such as a selected one of electrically conductive elastomer materials, or electrically nonconductive elastomer materials including for example, a flexible metal fill in a polymer resin or a flexible magnetic fill in a polymer resin.

In accordance with features of the invention, the cavity receiving compliant foam optionally includes a conductive fabric coating with an absorber positioned on the outside of the conductive fabric coating.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and structures are provided for implementing press-lock electromagnetic compatibility (EMC) gaskets with an absorber. A gasket includes a plurality of fasteners received through a plurality of corresponding mounting apertures in a perforated support member for precise placement, and retention without adhesives. The corresponding mounting apertures have a diameter smaller than 1/20th of a wavelength of the highest frequency to be suppressed to remain independent of the shielding required.

Figure 1:
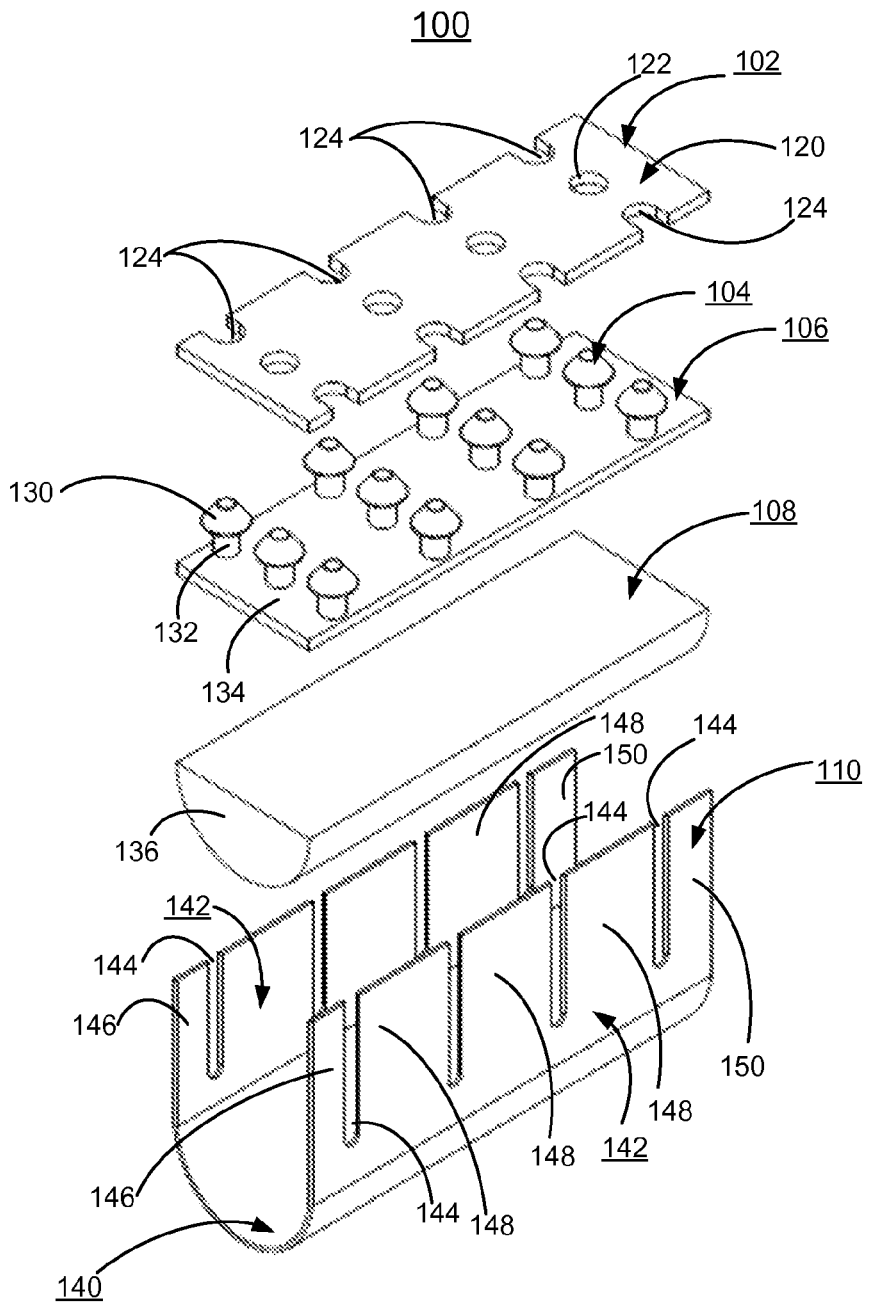
FIG. 1 is an exploded perspective view not to scale of an example press-lock electromagnetic compatibility (EMC) gasket with an absorber in accordance with a preferred embodiment.
Figure 2:
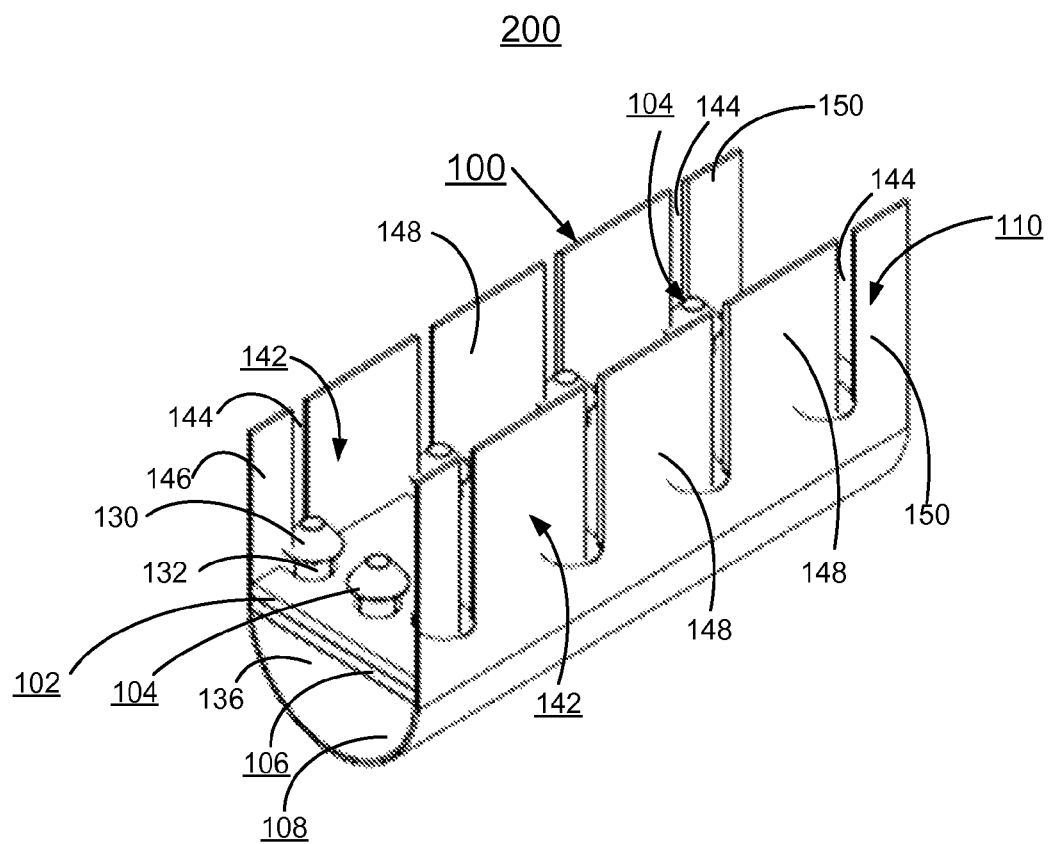
FIG. 2 is a perspective view not to scale illustrating an intermediate assembly of the press-lock electromagnetic compatibility (EMC) gasket with an absorber of FIG. 1 in accordance with a preferred embodiment.
Figure 3:
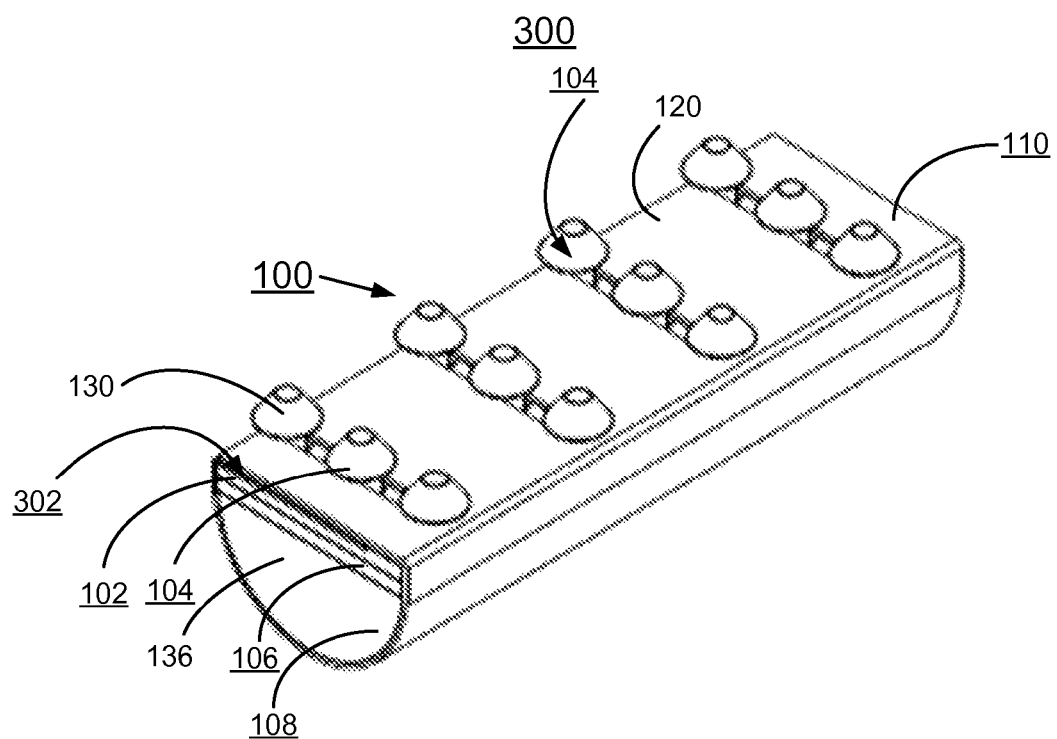
FIG. 3 is a perspective view not to scale illustrating a complete assembly of the press-lock electromagnetic compatibility (EMC) gasket with an absorber of FIG. 1 in accordance with a preferred embodiment.

Having reference now to the drawings, in FIGS. 1-3, there is shown not to scale an example press-lock electromagnetic compatibility (EMC) gasket with an absorber generally designated by the reference character 100 in accordance with a preferred embodiment.

As shown in exploded view in FIG. 1, the press-lock electromagnetic compatibility (EMC) gasket 100 includes a gasket perforated member generally designated by the reference character 102, a plurality of fasteners generally designated by the reference character 104 fitted in a base member generally designated by the reference character 106, a gasket cavity enclosure generally designated by the reference character 108, and an enclosure member generally designated by the reference character 110.

The gasket perforated member 102 includes an upper perforated surface 120. The gasket perforated member 102 includes a plurality of generally centrally located apertures 122 and a plurality of notches 124 spaced apart along each side of the member. As shown in FIGS. 2 and 3, the plurality of fasteners 104 are received through the apertures 122 and notches 124 in the electromagnetic compatibility (EMC) gasket 100.

Each of the fasteners 104 includes an enlarged resilient head 130 and a shaft 132 fitted in the base member 106. The enlarged resilient head 130 is received through the apertures 122 and notches 124 in the gasket perforated member 102.

In use the press-lock EMC gasket 100 is mounted to a chassis or panel perforated supporting member by the plurality of fasteners 104 in press-fit or press-lock engagement with the enlarged resilient head 130 passing through a perforated surface and essentially locks in place preventing easy removal. The fasteners 104 optionally have a profile, for example, including the enlarged resilient head 130 for preventing easy removal.

Figure 5:
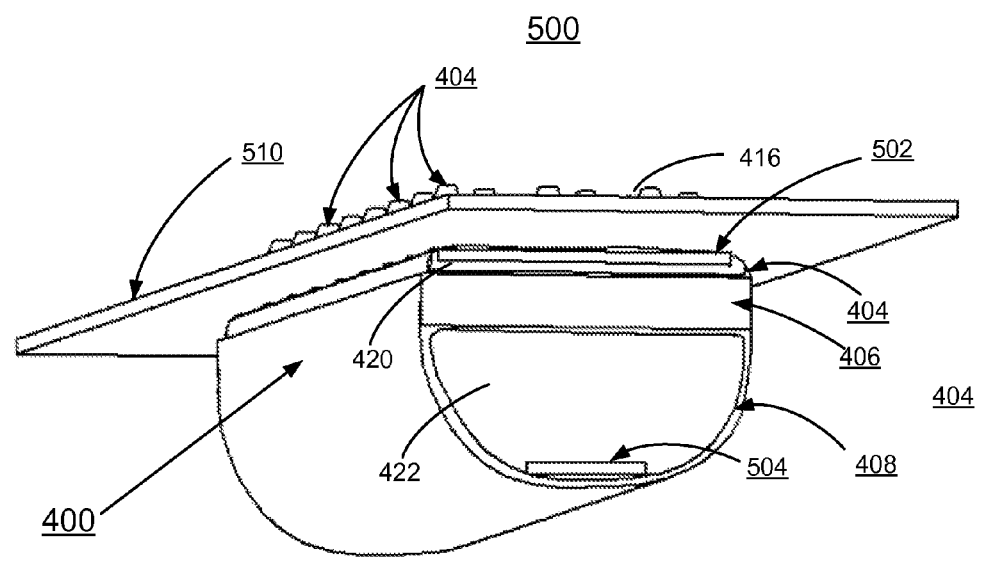
FIG. 5 is a perspective view not to scale illustrating the press-lock electromagnetic compatibility (EMC) gasket with an absorber of FIG. 4 mounted with a perforated surface in accordance with a preferred embodiment.

The gasket cavity enclosure 108 is filled with compliant foam 136, such as polyurethane foam and optionally includes an absorber, such as an absorber 504 shown in FIG. 5, or supports an absorber 302 as shown in FIG. 3.

The gasket enclosure member 110 includes a base or bottom 140 and a pair of side walls 142 extending from the bottom wall 140 defining an opening, as shown in FIGS. 1-3, for receiving the gasket cavity enclosure 108. The side walls 142 include spaced apart slots 144 corresponding to the notches 124 in the perforated member 102 for receiving the fasteners 104 positioned along the sides of the base member 106. The slots 144 are defined in the side walls 142 by a first pair of end sections 146, a plurality of interior sections 148, and a second pair of end sections 150.

The gasket enclosure member 110 is formed of a selected material having sufficient strength and electromagnetic compatibility properties, such as a selected one of beryllium copper and stainless steel. For example, the gasket enclosure member 110 is formed of a thin sheet of beryllium copper or stainless steel. It should be understood that other rigid or compliant material having sufficient strength and electromagnetic compatibility properties can be used to form the gasket enclosure member 110.

Referring to FIG. 2, there is shown an intermediate assembly generally designated by the reference character 200 of the press-lock electromagnetic compatibility (EMC) gasket 100 in accordance with a preferred embodiment. In the illustrated intermediate assembly 200 of the press-lock EMC gasket 100, gasket enclosure member 110 contains the gasket cavity enclosure 108 with compliant foam 136, the base member 106 fitted with the plurality of fasteners 104 received through the apertures 122, and notches 124 of the perforated member 102 and the slots 144 of the gasket enclosure member 110.

Referring to FIG. 3, there is shown a complete assembly generally designated by the reference character 300 of the press-lock electromagnetic compatibility (EMC) gasket 100 with an absorber 302 in accordance with a preferred embodiment. The absorber 302 is formed of an RF absorber material, such as a selected one of electrically conductive elastomer materials, or electrically nonconductive elastomer materials including for example, a flexible metal fill in a polymer resin or a flexible magnetic fill in a polymer resin.

In the illustrated complete assembly 300 of the press-lock EMC gasket 100, the side wall sections 146, 148, 150 of the gasket enclosure member 110 are folded over, containing the interior gasket cavity enclosure 108 with compliant foam 136, the base member 106 fitted with the plurality of fasteners 104 received through the apertures 122, and notches 124 of the perforated member 102.

As shown the illustrated complete assembly 300 in FIG. 3 of the press-lock EMC gasket 100 is mounted to a chassis or panel perforated supporting member by the plurality of fasteners 104 in press-fit or press-lock engagement. The enlarged resilient head 130 of the fasteners is received through the corresponding aperture for retaining the gasket with the associated perforated support member, such as a supporting member 510 shown in FIG. 5.

Figure 4:
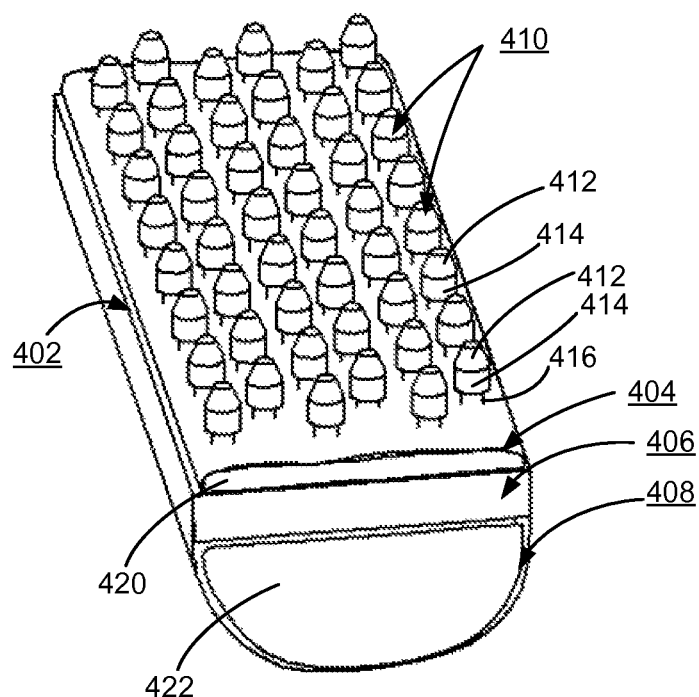
FIG. 4 is a perspective view not to scale illustrating another example press-lock electromagnetic compatibility (EMC) gasket with an absorber in accordance with a preferred embodiment.

Referring to FIGS. 4 and 5, there is shown another example press-lock electromagnetic compatibility (EMC) gasket with an absorber generally designated by the reference character 400 in accordance with a preferred embodiment. The press-lock EMC gasket 400 includes a perforated member 402, a first gasket cavity enclosure 404, an absorber base 406, a second gasket cavity enclosure 408, and a plurality of fasteners 410.

Each of the plurality of fasteners 410 includes an upper enlarged resilient tapered head 112, an intermediate enlarged portion 114, and a shank 116 fitted in or through the perforated member 402. The fasteners 410 have a profile including for example, the enlarged resilient tapered head 112 together with the intermediate enlarged portion 114 for preventing easy removal when mounted with an associated supporting member 510, as shown in FIG. 5.

Compliant foam is provided in each of the first gasket cavity enclosure 404 and the second gasket cavity enclosure 408. The press-lock EMC gasket 400 includes a respective absorber 502, 504 received within the cavity 404, 408 with the compliant foam 420, 422, as shown in FIG. 5.

Referring to FIG. 5, there is shown an assembly generally designated by the reference character 500 of the press-lock electromagnetic compatibility (EMC) gasket 400 with associated perforated supporting member 510 in accordance with a preferred embodiment.

As shown in FIG. 5, in the assembly 500, the press-lock EMC gasket 400 is mounted with the plurality of fasteners 410 received through corresponding mounting apertures for precise placement, and retention without adhesives in a supporting member 510 in accordance with a preferred embodiment.

The absorber 302 of the press-lock EMC gasket 100 and the absorber 502, 504 of the press-lock EMC gasket 400 are formed of RF absorber material including a selected one of an electrically conductive elastomer material, and an electrically nonconductive elastomer material. The absorbers 302, 502, 504 optionally a flexible metal or magnetic fill, for example, contained in a polymer resin, and can include an aluminum foil shielding layer.

In the assembly 500, the press-lock EMC gasket 400 is mounted within the supporting member 510 by the fasteners 410 and the compliant foam 420 under the fasteners 410 is compressed to the proper force and held into place with the back side of the fasteners 410.

Figure 6:
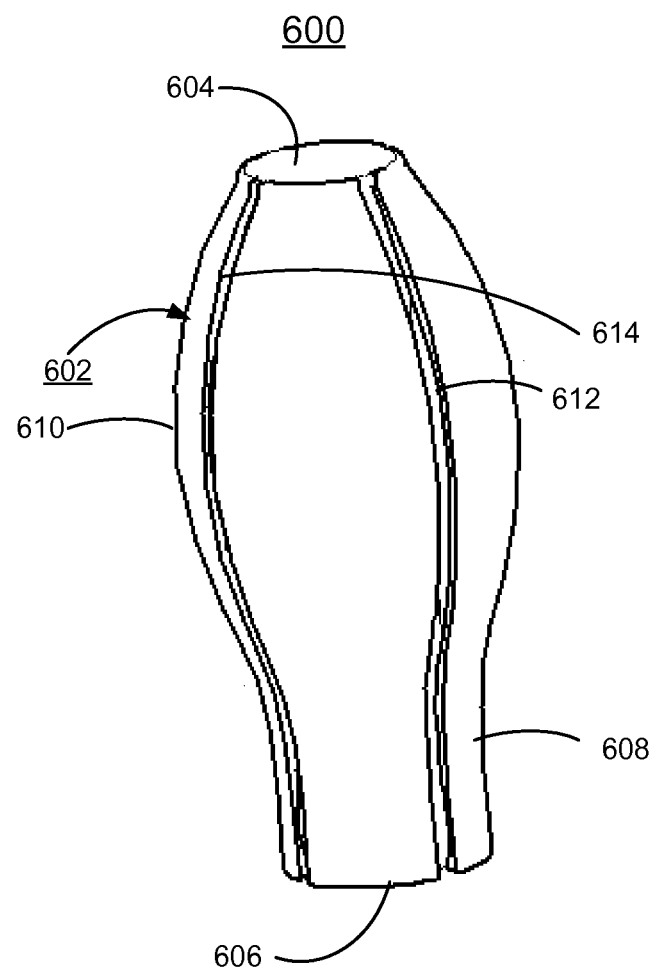
FIG. 6 is a perspective view not to scale illustrating another example shank panel fastener for use in the press-lock electromagnetic compatibility (EMC) gaskets with an absorber in accordance with a preferred embodiment.

Referring to FIG. 6, there is shown not to scale another example fastener generally designated by the reference character 600 in accordance with a preferred embodiment. The fastener 600 advantageously is used in the press-lock electromagnetic compatibility (EMC) gaskets 100, 400 in accordance with a preferred embodiment.

The fastener 600 includes a generally tapered profile generally designated by the reference character 602 extending between an upper surface 604 and a lower surface 606. The fastener 600 includes a lower shank 608 and an enlarged section 610 received through the corresponding aperture for retaining the gasket 100, 400 with the associated perforated support member, such as a supporting member 510 shown in FIG. 5. The fastener 600 includes spaced apart elongated recesses or groves 612, 614 extending between the upper surface 604 and lower surface 606.

The fasteners 104, 410, and 600 are formed of either an electrically nonconductive or electrically conductive material, for example, a plastic material or a metal material. The fasteners 104, 410, and 600 optionally include a fabric wrapping, and are spaced apart in rows allowing enough room for spacing between the rows to facilitate fabric wrapping.

The absorber base 406 of the press-lock EMC gasket 400 and members 102, 106 of the press-lock EMC gasket 400 is formed of RF absorber material. The absorber base 406 and members 102, 106 could be provided with a conductive fill, such as a Faradex compound to further increase EMC effectiveness.

While the present invention has been described with reference to the details of the embodiments of the invention shown in the drawing, these details are not intended to limit the scope of the invention as claimed in the appended claims.

What is claimed is:

1. A structure for implementing for implementing a press-lock electromagnetic compatibility (EMC) gasket comprising:
   a perforated support member including a plurality of corresponding mounting apertures;
   a gasket including a plurality of fasteners received through said plurality of said corresponding mounting apertures in said perforated support member for precise placement, and retention without adhesives; said corresponding mounting apertures having a diameter smaller than 1/20th of a wavelength of the highest frequency to be suppressed;
   a gasket enclosure defining a cavity receiving compliant foam; and
   an absorber received in said gasket enclosure.

2. The structure as recited in claim 1 wherein said perforated support member includes a perforated surface formed of an electrically conductive material.

3. The structure as recited in claim 1 wherein said perforated support member includes a perforated surface formed of an electrically nonconductive material.

4. The structure as recited in claim 1 wherein each of said plurality of fasteners includes a shaft and an enlarged resilient head received through the corresponding mounting aperture.

5. The structure as recited in claim 4 wherein said enlarged resilient head has a predefined profile for preventing easy removal.

6. The structure as recited in claim 1 wherein said plurality of fasteners include a fabric wrapping.

7. The structure as recited in claim 1 wherein said plurality of fasteners are formed of an electrically nonconductive material.

8. The structure as recited in claim 1 wherein said plurality of fasteners are formed of an electrically conductive material.

9. The structure as recited in claim 1 wherein said plurality of fasteners includes a shaft and an enlarged resilient head received through the corresponding mounting aperture, and said shaft being electrically conductive and having a set diameter substantially filling the corresponding mounting aperture for providing lower impedance.

10. The structure as recited in claim 1 includes an absorber base with an absorber positioned above the absorber base.

11. The structure as recited in claim 10 wherein said absorber base is formed of RF absorber material.

12. The structure as recited in claim 10 wherein said absorber base includes a conductive fill.

13. The structure as recited in claim 1 wherein said absorber is formed of an RF absorber material including a selected one of an electrically conductive elastomer material, and an electrically nonconductive elastomer material.

14. The structure as recited in claim 1 wherein said enclosure s formed of a selected one of beryllium copper and stainless steel.

15. The structure as recited in claim 1 wherein said compliant foam includes polyurethane foam.

16. A method for implementing a press-lock electromagnetic compatibility (EMC) gasket comprising:
   providing a perforated support member including a plurality of corresponding mounting apertures; said corresponding mounting apertures having a diameter smaller than 1/20th of a wavelength of the highest frequency to be suppressed
   providing a gasket with a plurality of fasteners for press-fit engagement into said corresponding mounting apertures;
   providing a gasket enclosure defining a cavity receiving compliant foam; and
   providing an absorber in said gasket enclosure;
   mounting said gasket with said plurality of fasteners received through corresponding mounting apertures for precise placement, and retention without adhesive.

17. The method as recited in claim 16 wherein providing a gasket including a plurality of fasteners includes providing said plurality of fasteners with a shaft and an enlarged resilient head received through the corresponding mounting aperture.

18. The method as recited in claim 17 wherein said plurality of fasteners are formed of an electrically nonconductive material.

19. The method as recited in claim 17 wherein said plurality of fasteners are formed of an electrically conductive material, and said shaft having a set diameter substantially filling the corresponding mounting aperture for providing lower impedance.

20. The method as recited in claim 16 wherein mounting said gasket with said plurality of fasteners received through corresponding mounting apertures includes compressing said compliant foam in said cavity.

\* \* \* \* \*